(12) United States Patent
Polce et al.

(10) Patent No.: US 8,334,451 B2
(45) Date of Patent: Dec. 18, 2012

(54) DISCRETE AND INTEGRATED PHOTO VOLTAIC SOLAR CELLS

(75) Inventors: Nestore Polce, Chelmsford, MA (US); Ronald P. Clark, Peabody, MA (US); Nathan Zommer, Los Altos, CA (US)

(73) Assignee: IXYS Corporation, Milpitas, CA (US)

( * ) Notice: Subject to any disclaimer, the term of this patent is extended or adjusted under 35 U.S.C. 154(b) by 1129 days.

(21) Appl. No.: 10/958,698

(22) Filed: Oct. 4, 2004

(65) Prior Publication Data

US 2005/0145274 A1 Jul. 7, 2005

Related U.S. Application Data

(60) Provisional application No. 60/508,351, filed on Oct. 3, 2003.

(51) Int. Cl.
*H01L 31/00* (2006.01)

(52) U.S. Cl. ........ 136/249; 136/251; 136/244; 257/518; 257/588; 257/505; 257/520; 257/586; 257/514; 257/515; 257/523; 257/524; 438/98; 438/94; 438/57

(58) Field of Classification Search .................. 136/244, 136/251, 249; 438/57, 98, 94; 257/518, 257/588, 505, 520, 586, 514, 515, 523, 524
See application file for complete search history.

(56) References Cited

U.S. PATENT DOCUMENTS

| | | | | |
|---|---|---|---|---|
| 4,514,579 A * | 4/1985 | Hanak | ............................ | 136/249 |
| 4,617,421 A * | 10/1986 | Nath et al. | ..................... | 136/244 |
| 4,785,337 A * | 11/1988 | Kenney | ........................... | 257/304 |
| 4,860,072 A * | 8/1989 | Zommer | ........................ | 257/144 |
| 5,063,307 A * | 11/1991 | Zommer | ........................ | 327/512 |
| 5,406,111 A * | 4/1995 | Sun | ................. | 257/497 |
| 5,549,762 A * | 8/1996 | Cantarini | ...................... | 136/249 |
| 5,856,700 A * | 1/1999 | Woodbury | ..................... | 257/518 |
| 5,994,718 A * | 11/1999 | Demirlioglu | .................... | 257/65 |
| 6,201,179 B1 * | 3/2001 | Dalacu | ........................... | 136/244 |
| 6,207,512 B1 * | 3/2001 | Manning | ...................... | 438/294 |
| 6,225,668 B1 * | 5/2001 | Shindo et al. | .................. | 257/368 |
| 6,266,268 B1 * | 7/2001 | Noble | ........................... | 365/149 |
| 6,787,693 B2 * | 9/2004 | Lizotte | ........................... | 136/261 |
| 2001/0013627 A1 * | 8/2001 | Cantarini et al. | ............. | 257/397 |
| 2002/0030767 A1 * | 3/2002 | Zavracky et al. | ............... | 349/42 |
| 2002/0086456 A1 * | 7/2002 | Cunningham et al. | .......... | 438/57 |
| 2004/0082140 A1 * | 4/2004 | Yang et al. | ..................... | 438/424 |
| 2004/0171220 A1 * | 9/2004 | Yang et al. | .................... | 438/270 |

\* cited by examiner

*Primary Examiner* — Jonathan Johnson
*Assistant Examiner* — Golam Mowla
(74) *Attorney, Agent, or Firm* — Kilpatrick Townsend & Stockton LLP

(57) ABSTRACT

A photovoltaic (PV) cell device comprises a first semiconductor substrate; a second semiconductor substrate bonded to the first semiconductor substrate; an insulating layer provided between the first and second substrates to electrically isolate the first substrate from the second substrate; a plurality of PV cells defined on the first substrate, each PV cell including a n-type region and a p-type region; a plurality of vertical trenches provided in the first substrate to separated the PV cells, the vertical trenches terminating at the insulating layer; a plurality of isolation structures provided within the vertical trenches, each isolation structure including a first isolation layer including oxide and a second isolation layer including polysilicon; and an interconnect layer patterned to connect the PV cells to provide X number of PV cells in series and Y number of PV cells in parallel. The n-type regions are formed by performing ion implantation of arsenic to provide shallow junction depths for the n-type regions, so that PV cell device is optimized for sunlight.

18 Claims, 8 Drawing Sheets

DISCRETE AND INTEGRATED PHOTO VOLTAIC SOLAR CELLS

CROSS REFERENCES TO RELATED APPLICATIONS

The present application claims priority from U.S. Provisional Patent Application No. 60/508,351, filed on Oct. 3, 2003, which is incorporated by reference.

BACKGROUND OF THE INVENTION

The present invention relates to solar cells formed on a semiconductor substrate.

State of the art high efficiency photo voltaic ("PV") solar cells have been introduced as a component in a die (chip) or wafer. A typical solar cell producer uses semiconductor manufacturing processes that are specialized to produce the PV solar cells. The same producer sells the solar cells in the form of chips or wafers. Each solar cell is formed on a single chip or wafer. The buyer of these cells then assembles them in large panels in a series or series-and-parallel combination to produce a higher output power than is possible from one monolithic solar cell.

A solar cell, in its basic form, is a p/n junction (a diode) that generates 0.4-0.7 volts when light shines on it. The high efficiency cells produce the higher voltage range, which is about 0.65v to 0.7v. Accordingly, a user of these cells generally has to connect them in series to generate a higher, more useful voltage. A plurality of such solar cell arrays are connected in parallel to produce higher output current, thereby generating higher electrical power.

For a 6 volt output, 10 PV cells are generally connected in series. Each chip has to be isolated from each other and connected in a scheme, as shown in FIG. 1A, where solar cells PV1 to PV10 are connected in series. The potential of a node 1 is about 6 volts above that of a node 20.

FIG. 1B shows a die bonding and mounting on a substrate 80, where the PV chips are 41-50, representing 10 PV cells, are connected in series. FIG. 1B illustrates a component configuration corresponding to FIG. 1A. The connections are done via conducting wires 61-71. The dice are mounted on conductor pads 21-30. As shown, many additional components (e.g., the connecting wires, conductor pads, and substrate) are needed to place the solar cells in series and obtain a higher voltage output. This results in increased material and labor costs.

One proposed solution has been to use a dielectric isolation (DI) technology. This technology provides a monolithic chip or substrate having a higher voltage output without using connecting wires, conductor pads, and other external components. The DI technology may be used to provide a monolithic substrate having a plurality of solar cells. At first, a photoresist layer is provided on a front side of a silicon substrate. The photoresist is patterned and etched to expose certain parts of the silicon substrate. The exposed parts are etched to form a plurality of grooves on the substrate. The photoresist is then removed.

The substrate is doped with impurities to form a buried layer. An oxide layer is formed on the buried layer. A polysilicon layer is deposited on the oxide layer to a thickness of 500 microns or more. The substrate is then flipped over and grinded to remove excess portions of silicon substrate on the backside.

The DI technology is costly and is generally considered to be impractical. This technology, as explained above, requires deposition of a thick layer of polysilicon and then mechanical coarse grinding techniques, which is both costly and results in a high degree of defects. Also, it is difficult to make a small-sized solar cell devices using the DI technology due to its coarse grinding step.

SUMMARY OF THE INVENTION

The present invention relates to a plurality of photo voltaic (PV) solar cells formed on a single or monolithic semiconductor substrate. These PV cells are integrated as a single PV device that outputs a given voltage. The output voltage of the PV device may be customized to a desired level by appropriately connecting a given number of the PV cells in series during fabrication steps of the PV device. Similarly, the output current is also customized to a desired level by appropriately connecting the PV cells in parallel during the fabrication of the PV device. These series and parallel connections are obtained by patterning the interconnect (or metal) layer that is deposited on top of the solar cells.

By using microelectronic techniques disclosed herein, the resultant PV device that outputs a high voltage (e.g., 3 volts) is made much smaller than a conventional device that outputs comparable voltage (see FIG. 1B). In the present embodiment, a relatively small die sized PV device can be packaged in simple packages, like the ones used in discrete semiconductor devices, e.g., LEDs, transistor diodes etc., with a transparent plastic encapsulation.

As used herein, a packaged device including a PV die is referred to as a "packaged PV device." The packaged PV device may include one or more PV dice as well as other components. As used herein, a "PV device" generally refers to a die including one or more solar cells. However, PV device may also refer to a packaged PV device, particularly when used in the claims.

In one embodiment, a packaged PV device has a plurality of pins, e.g., two pins, and can be used as a discrete component in a desired circuit or product. Such a discrete product (or a single packaged product) contains one or more small, packaged PV devices with high voltage outputs. Each PV device or die generates about 0.6-0.7 volt of output. The discrete product enables the operation of portable electronic devices with off-line battery chargers, namely using light energy to charge the battery. With the use of such a discrete product, wireless electronic devices or instruments may be mounted virtually anywhere and operated without a fixed power line. These electronic devices can be powered using solar energy using the high efficiency PV devices described herein.

Modem IC's often requires very low operating or quiescent currents, which the present PV devices can power by charging the battery or energy storage capacitors in the IC's as part of an electronic device. The present PV device of the present invention may be used in various electronic devices, e.g., remote sensors, which are wireless and free of the need to be connected to a power line. Also, the PV dice themselves can be used as part of batteries to trickle charge the batteries internally if a PV device is implemented as part of the battery. To charge the batteries, a PV device of the desired voltage needs to be selected. For a 1.5 volt batteries, a PV device having 3 PV cells that are integrated to provide about 1.8 volt is needed in the present implementation. The number of PV cells that need to be connected in series depends on the voltage output desired for a PV device.

In one embodiment, a photovoltaic (PV) cell device comprises a first semiconductor substrate; a second semiconductor substrate bonded to the first semiconductor substrate; an insulating layer provided between the first and second substrates to electrically isolate the first substrate from the second substrate; a plurality of PV cells defined on the first substrate, each PV cell including a n-type region and a p-type region; a plurality of vertical trenches provided in the first substrate to separated the PV cells, the vertical trenches terminating at the insulating layer; a plurality of isolation structures provided within the vertical trenches, each isolation structure including a first isolation layer including oxide and a second isolation layer including polysilicon; and an interconnect layer patterned to connect the PV cells to provide X number of PV cells in series and Y number of PV cells in parallel. The n-type regions are formed by performing ion implantation of arsenic to provide shallow junction depths for the n-type regions, so that PV cell device is optimized for sunlight.

Each trench has a width of the opening of that is greater than 5,000 angstroms. Each trench may have a width of at least 2 microns or a width of about 3 microns or more.

In yet another embodiment, a packaged photovoltaic (PV) device includes a PV structure including a silicon-on-silicon (SOI) structure. The PV structure comprises a first silicon semiconductor substrate; a second semiconductor substrate bonded to the first substrate; an insulating layer provided between the first and second substrates to electrically isolate the first substrate from the second substrate; a plurality of PV cells defined on the first substrate, each PV cell including a n-type region and a p-type region; a plurality of trenches provided in the first substrate to separated the PV cells, each trench having a width greater than 1 micron; a plurality of isolation structures provided within the trenches, each isolation structure including a first isolation layer including oxide and a second isolation layer including polysilicon; and an interconnect layer patterned to connect the PV cells to provide X number of PV cells in series and Y number of PV cells in parallel, wherein the n-type regions are formed by performing ion implantation of arsenic to provide shallow junction depths for the n-type regions. The packaged PV device also includes an electronic component to perform a given function; and a transparent enclosure that encloses both the PV structure and the electronic component.

DETAILED DESCRIPTION OF THE INVENTION

The present invention relates to photo voltaic solar cells. For part of the reasons described above in the background, embodiments of the present invention provide a structure and a method of making a PV chip that can provide a high voltage output by integrating multiple single PV solar cell diodes in one monolithic substrate, e.g., silicon substrate or crystal.

Figure 1A:
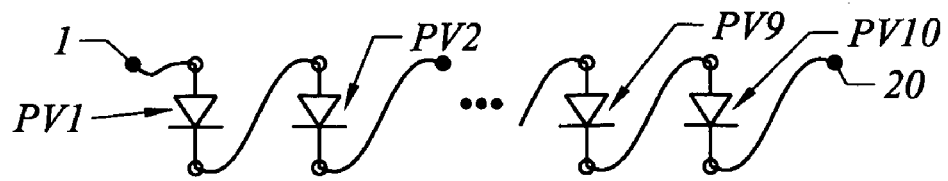
FIG. 1A illustrates a circuit diagram of a plurality of PV cells in a series connection.
Figure 1B:
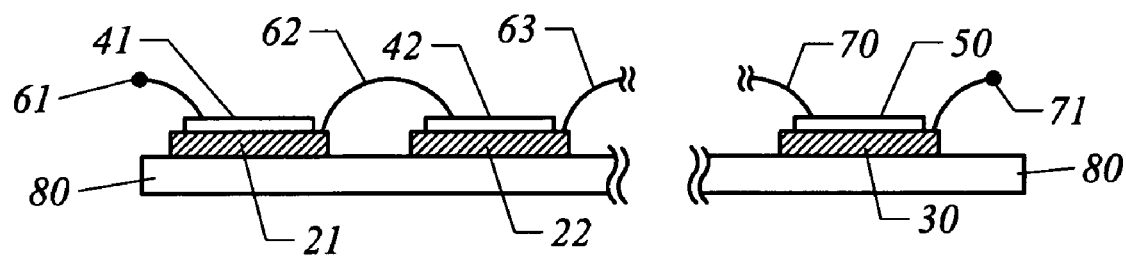
FIG. 1B illustrates a plurality of PV cells connected in series using a conventional wiring connection method.
Figure 2A:
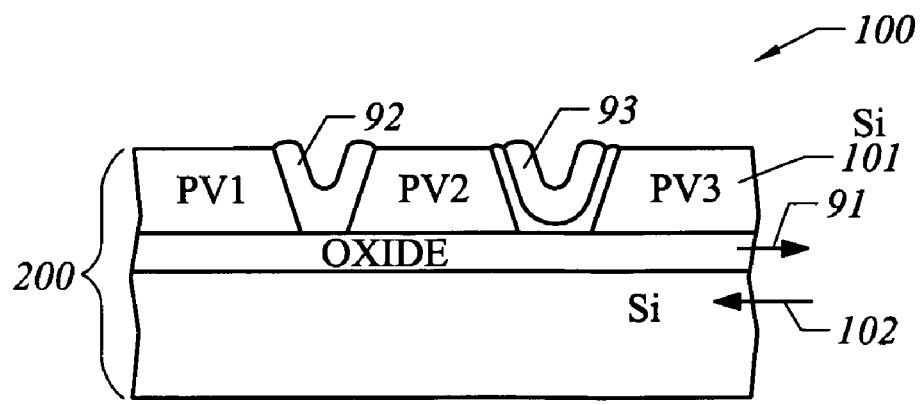
FIG. 2A illustrates a cross-sectional view of PV device according to one embodiment of the present invention.

FIG. 2A illustrates a cross-sectional view of a discrete PV device or die 100 according to one embodiment. The PV device 100 is formed using an SOI (Silicon on Insulator) technique to fabricate high efficiency PV cell arrays on a single semiconductor die. The die is packaged as a single discrete device. The PV device includes a first silicon substrate 101 and a second silicon substrate 102. At least one of the two substrates is thermally oxidized to form a silicon dioxide layer 91. The two substrates are bonded together by sandwiching the silicon dioxide layer between them. This creates a bonded structure 200. This structure is also referred to as a wafer bonded structure (WBS) since wafers are generally in the current SOI technology. As well known by those skilled in the art, a plurality of PV devices are defined on the WBS and cut into a plurality of PV devices or dice.

Figure 3:
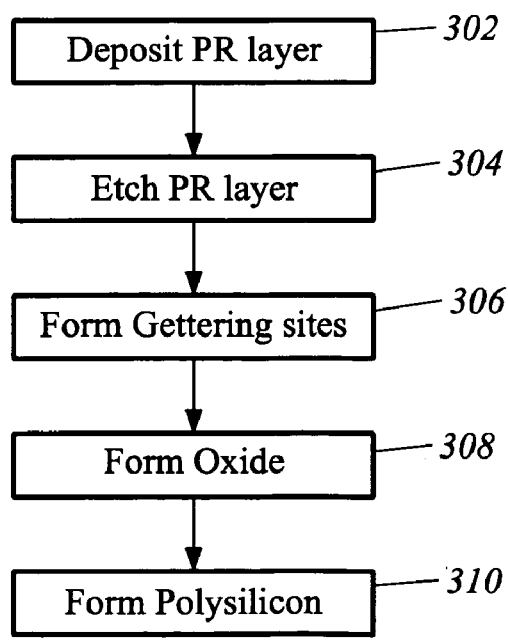
FIG. 3 illustrates a process of forming a PV device according to one embodiment of the present invention.

The PV devices are formed on the WBS 200 using semiconductor fabrication techniques (see FIG. 3). A photoresist layer is deposited on the upper side of the WBS 200 and patterned to expose certain areas of the first substrate 101 (step 302). The exposed areas are etched to form a plurality of trenches (step 304). These trenches are used to isolate the tubs or active regions whereon the PV solar cells are formed. The trenches are provided with a width of about 3 microns to ensure the isolation between adjacent PV cells . The trench sidewalls are doped to provide internal gettering sites for material defects and impurities (step 306). A silicon dioxide layer is deposited or thermally grown on the trench sidewalls whereon the gettering sites have been formed (step 308). The silicon dioxide layer preferably is at least about 3000 angstroms thick. An undoped polysilicon layer is formed over the silicon dioxide to fill the trenches (step 310). The oxide along is not used to completely fill the trenches since it is relatively high in stress. As the thickness of the oxide deposited on the silicon substrate increases, the stress on the silicon increases as well. For example, an oxide that is greater than about 5000 angstroms in thickness may cause a mechanical failure and damage the crystalline structure of the underlying silicon. That is, a mechanical slip is caused by the high stress resulting from the thick oxide. To present such an occurrence, polysilicon that exerts less stress on the silicon is used in conjunction with the oxide to fill the trenches and act as a insulating material that isolates adjacent tubs.

Referring back to FIG. 2A, the WBS 200 shows a plurality of PV cells (PV1, PV2, and PV3) formed on the first silicon substrate. Isolation structures 92 and 93 electrically isolate the PV cells. The isolation structures includes an oxide layer and undoped poly silicon layer, as described above. Each tub is a diode and includes a p-type region and an n-type region.

An interconnect, generally metal, connects the tubs or PV cells in series or parallel according to the desired configuration.

Figure 2B:
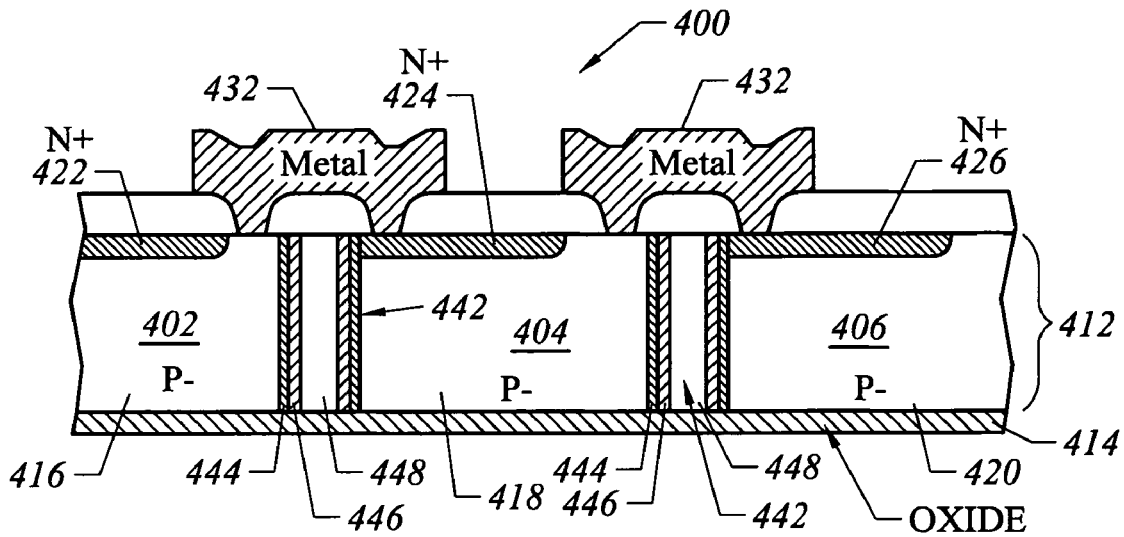
FIG. 2B illustrates a process of forming a PV device according to another embodiment of the present invention.

FIG. 2B illustrates a cross-sectional view of a PV device 400 according to another embodiment of the present invention. The PV device 400 includes a plurality of tubs 402, 404, and 406. The tubs are formed on a first silicon substrate 412 that overlies an oxide layer 414. A second silicon substrate (not shown) is provided below the oxide layer. The PV device 400 is made on a wafer bonded structure or SOI structure, as with the PV device 100 of FIG. 2A.

Each tub is a solar cell or PN junction diode that generates electrical current when light is shined thereon or photons are directed toward the surface thereof. The bodies of the tubs are p-type regions 416, 418, and 420. These regions have dopant concentration of about 4 e14 to 7 e14 Boron, and maybe referred to as p- regions. N-type regions 422, 424, and 426 are formed on the upper side of the p-type regions. These have dopant concentration of >5 e19 Arsenic and may be referred to n+ or emitter regions and can be adjusted both in junction depth and resistivity to be optimized for different wavelengths of light.

For example, in the present embodiment, the n+ regions are formed using ion implantation of arsenic to provide shallow junction depth of about 1 micron or less. The junction depth preferably should be no more than 2 microns deep to minimize photon recombination therein and provide highly efficient PV cells. The junction depth in question and the tub depth are configured for optimal performance under sunlight and fluorescent light.

A metal interconnect 432 connects the tubs 402, 404, and 406 in series to obtain a high voltage output. The metal interconnect is formed by depositing a metal layer, e.g., aluminum, and then etching it to obtain a desired connection pattern. The metal layer can be patterned to obtain a desired number of tubs in series connection to provide a desired voltage output. Similarly, the metal layer may be patterned to obtain a desired number of tubs in parallel connection to provide a desired level of current output.

The silicon tubs are separated by isolation structures 442 formed within a plurality of trenches. The trenches are vertically (anisotropically) etched in the present embodiment. Sidewalls of the trenches are doped to provide gettering sites 444. A silicon dioxide layer 446 is formed on the gettering sites. Undoped polysilicon is deposited in the trenches and chemically-mechanically polished (CMP) to form polysilicon plugs 448 that are used to fill the trenches.

In addition to the isolation structures 442, the tubs 402, 404, and 406 are electrically isolated from each other by forming them on the oxide layer 414 that has been previously formed to bond the first and second substrates in the SOI technology.

Using the above SOI technology, the resultant die can be scaled up for higher current by incorporating a larger PV diode area for more current output and more PV isolated elements in series for more voltage output. By using silicon substrates that are high quality single crystal silicon, the PV elements produce electrical power at higher efficiency than the DI technology.

Another advantage to the PV device based on SOI technology is derived from utilization of a vertical (anisotropic) etch technology. The resultant vertical trenches enables formation of tubs having a greater 3D volumetric tub area for a given diode size, particularly when compared to a PV device obtained using the DI technology. This is because the DI technology generally uses KOH etching, which is isotropic in nature, to form the trench. As a result sloping sidewalls are obtained.

In one embodiment, an analog or digital control circuits in an integrated form is defined on one of the plurality of PV cell as part of the overall PV device or die. Exemplary functions that can be integrated are: a) voltage regulation circuit, b) current regulation, c) lower voltage lock out (This means that the PV power output is delivered once a certain minimum voltage is achieved; below that voltage, the PV is 'locked' out from providing output power), d) protection circuitry to prevent electrostatic discharge damage (ESD protection), or other protection functions.

Figure 4A:
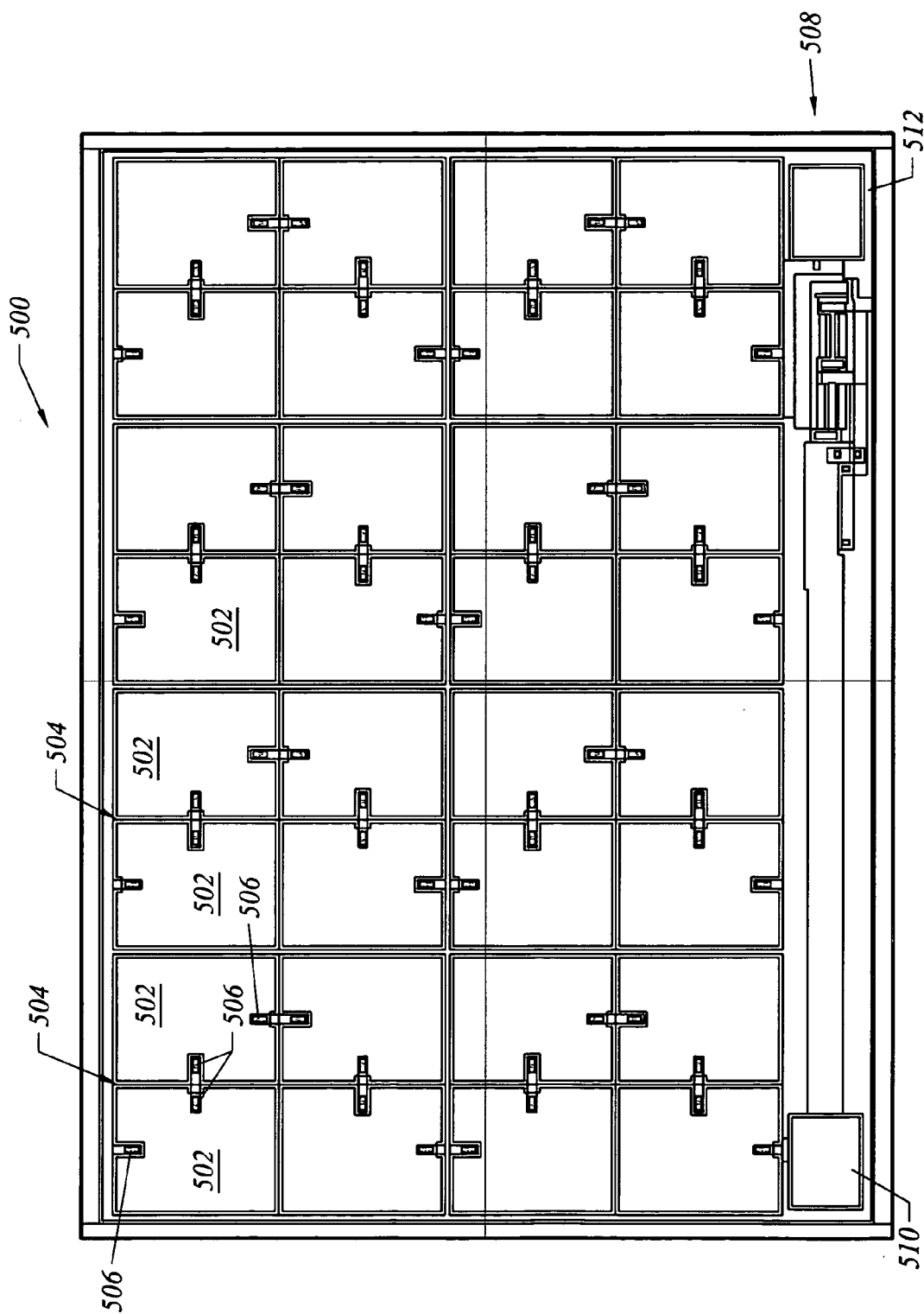
FIG. 4A illustrates a monolithic substrate or die defining a plurality of PV cells according to one embodiment of the present invention.

FIG. 4A illustrates a top view of a partially completed PV device 500 including a plurality of PV cells 502 according to one embodiment of the present invention. The PV device 500 corresponds to the PV device 400 in the present implementation. Adjacent cells are isolated from each other by isolation structures 504. Each cell has one or more contact regions 506. A metal interconnect is patterned to connect these contact regions in a given way to obtain X number of cells in series and Y number of cells in parallel. The number of cells in series is increased if a higher voltage output is desired. Similarly the number of cells in parallel is increased if a higher level of current output is desired. A control circuit 508 is formed at a lower portion of the die. First and second contact pads 510 and 512 are formed to provide electrical connection to an external device.

Figure 4B:
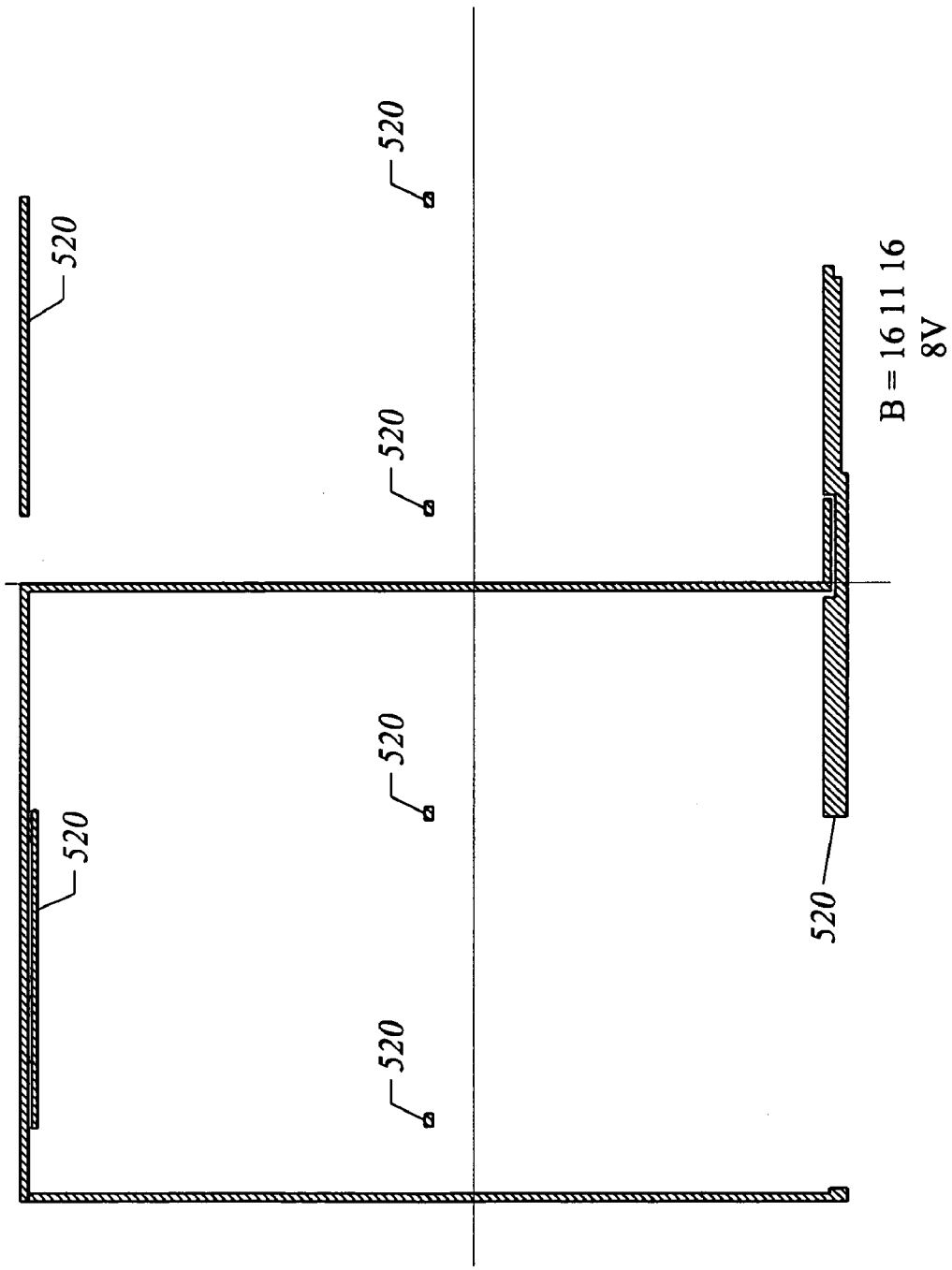
FIG. 4B illustrate a metal layer formed over the substrate of FIG. 4A to obtain 8 volts output according to one embodiment of the present invention.

FIG. 4B illustrates a top view of a metal interconnect 520 that is patterned on top of the partially completed PV device 500 to output about 8 volts according to one embodiment of the present invention. The metal interconnect is aluminum in the present embodiment. The metal interconnect connects the contact regions 506 in such a way that two arrays of 16 cells in series is obtained.

Figure 4C:
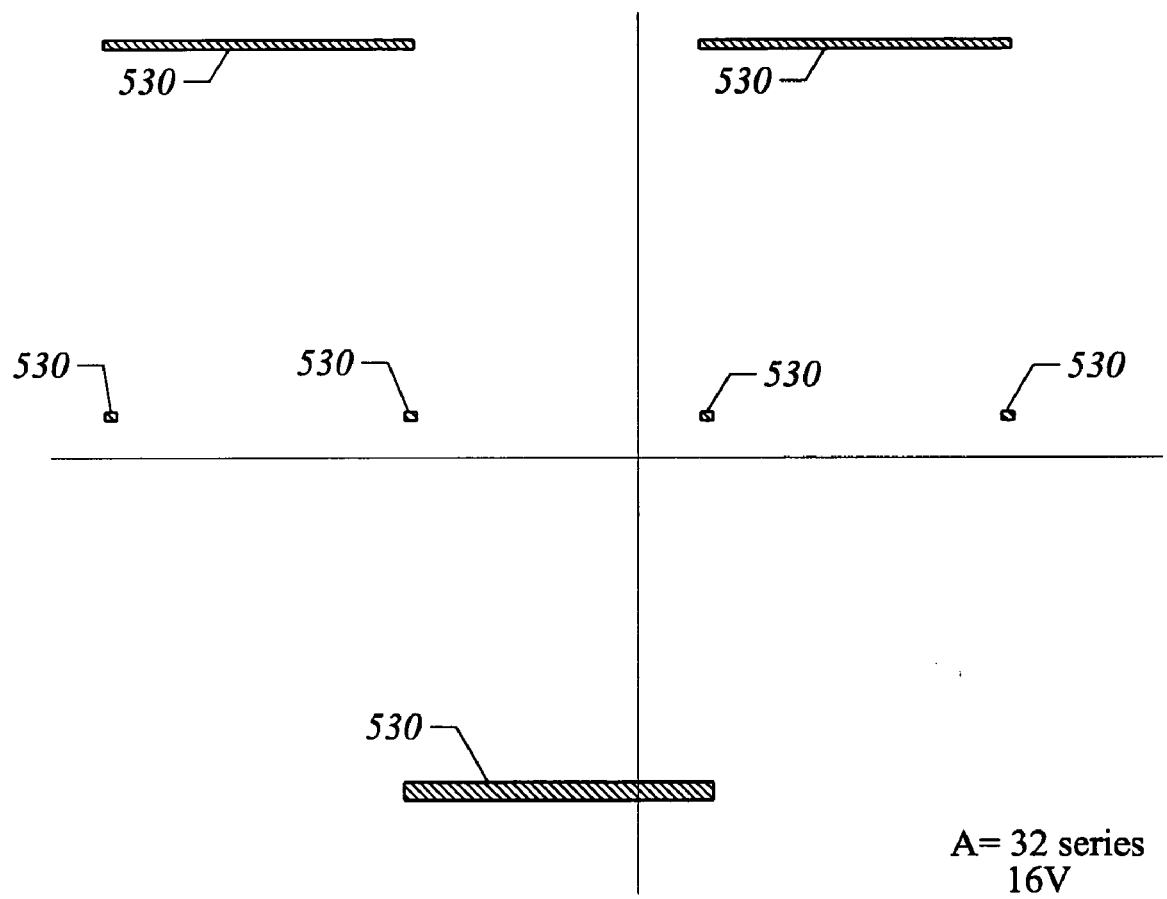
FIG. 4C illustrate a metal layer formed over the substrate of FIG. 4A to obtain 16 volt output according to one embodiment of the present invention.

FIG. 4C illustrates a metal interconnection 530 that is patterned on top of the partially completed PV device 500 to output about 16 volts according to one embodiment of the present invention. The metal interconnect connects the contact regions 506 in such a way that an array of 32 cells in series is obtained.

Figure 4D:
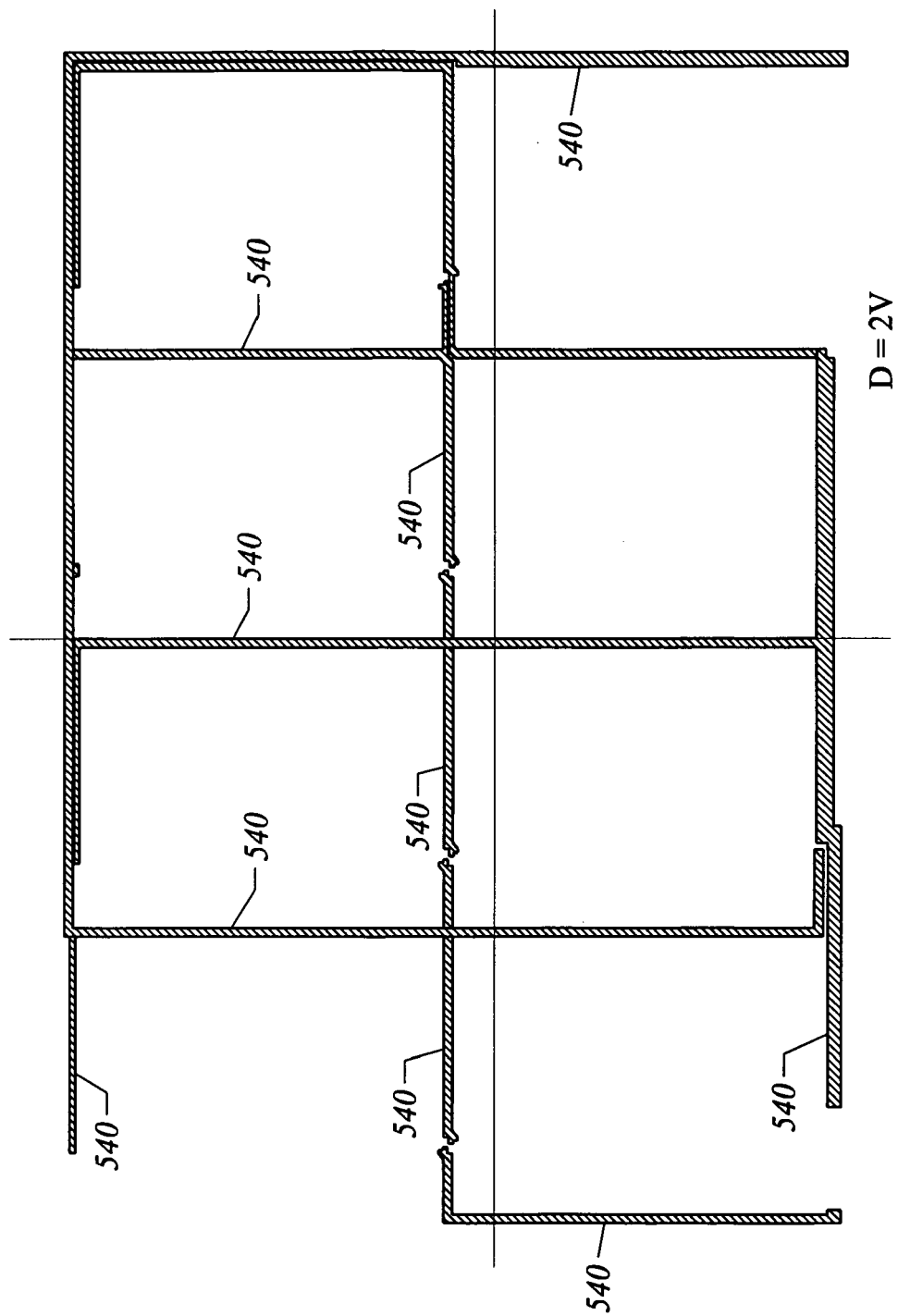
FIG. 4D illustrate a metal layer formed over the substrate of FIG. 4A to obtain 2 volt output according to one embodiment of the present invention.

FIG. 4D illustrates a metal interconnection 540 that is patterned on top of the partially completed PV device 500 to output about 16 volts according to one embodiment of the present invention. The metal interconnect connects the contact regions 506 in such a way that eight arrays of 4 cells in series is obtained.

Figure 4E:
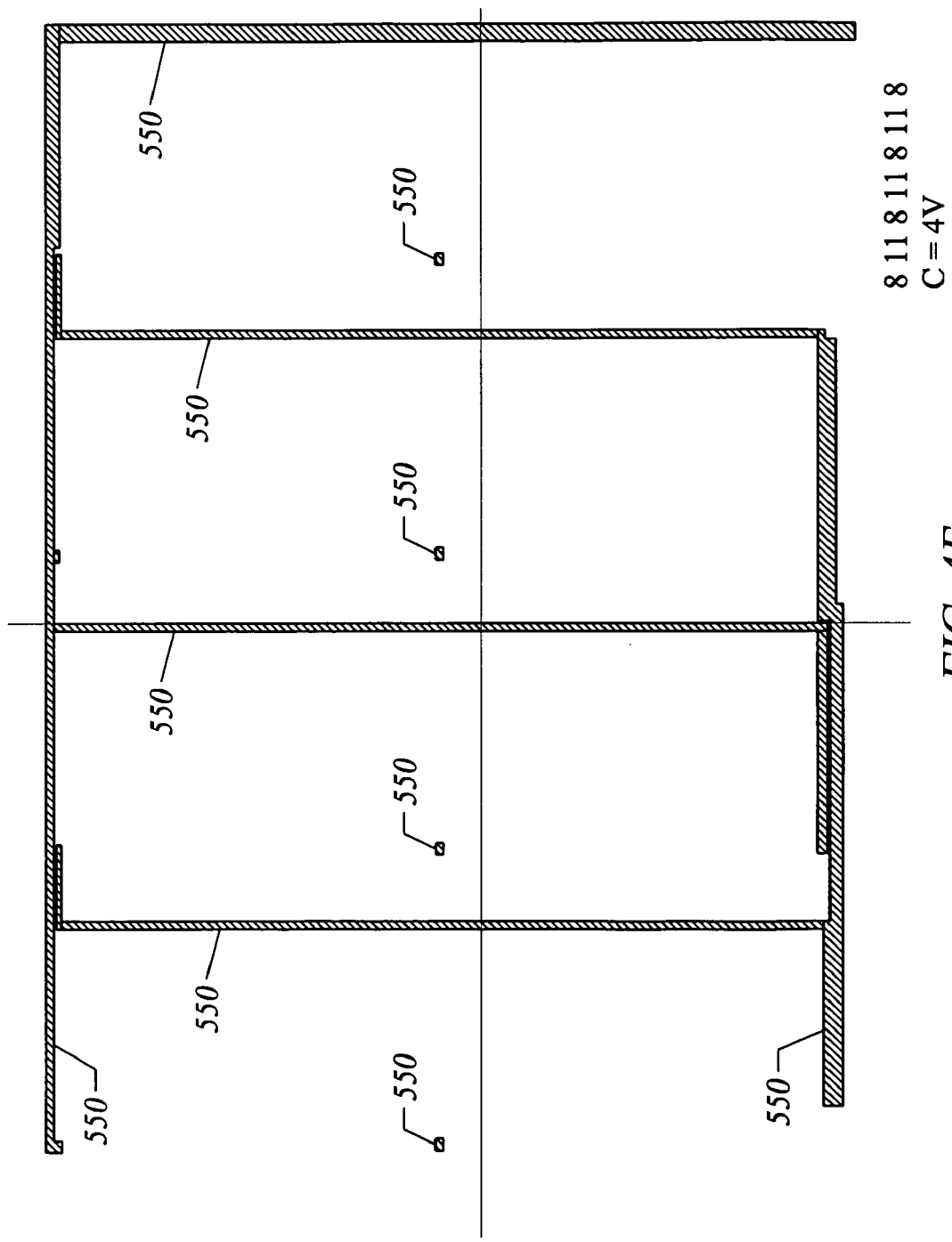
FIG. 4E illustrate a metal layer formed over the substrate of FIG. 4A to obtain 4 volt output according to one embodiment of the present invention.

FIG. 4E illustrates a metal interconnection 550 that is patterned on top of the partially completed PV device 500 to output about 16 volts according to one embodiment of the present invention. The metal interconnect connects the contact regions 506 in such a way that four arrays of 8 cells in series is obtained.

Figure 5A:
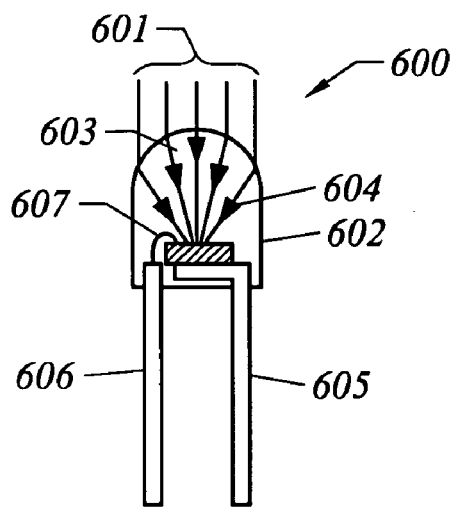
FIG. 5A illustrates a solar cell module having a lens according to one embodiment of the present invention.

FIG. 5A illustrates a packaged PV device 600 having a PV device or die 604 according to one embodiment of the present invention. The packaged PV device 600 includes a plastic or hermetic package with a transparent plastic or glass window 602. The window allows light, represented as arrows 601, to fall on the PV die 604. The die converts the light to electrical power. In particular, FIG. 5A illustrates the use of the PV die in a package for use as an LED. This LED has a dome or lens 603 to focus light onto the die. The electrical power is output through pins 605 and 606 that are coupled to the contact pads (see numeral 510 and 512 of FIG. 4A) of the die by a wire 607. This method of light concentration increases the power output of the encapsulated integrated PV.

Figure 5B:
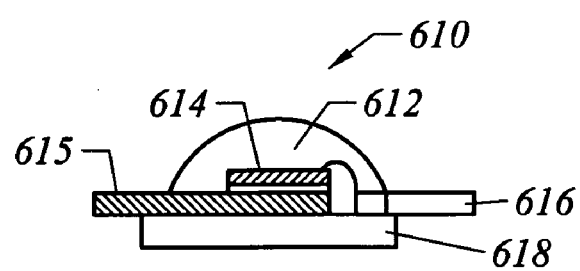
FIG. 5B illustrates a solar cell module having a lens according to another embodiment of the present invention.

FIG. 5B illustrates a discrete packaged PV device 610 with an integrated concentrating lens 612 and a PV device or die 614 according to another embodiment of the present invention. The electrical power is output through pins 615 and 616 that extends outwardly on the opposite sides of the packaged device. The backside 618 of the package device may be polymer or ceramic materials.

Figure 5C:
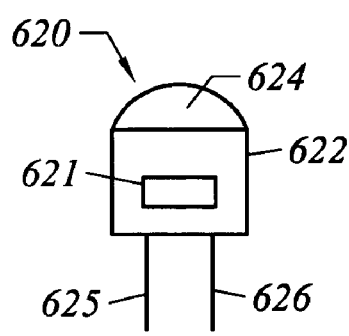
FIG. 5C illustrates a solar cell module having a lens according to yet another embodiment of the present invention.

FIG. 5C illustrates a metal-can-hermetic PV device 620 according to yet another embodiment of the present invention. A PV die 621 is mounted inside a metal housing 621. A curved lens 624 concentrates the light onto the die 621. Pins 625 and 626 are used to output the electrical power resulting from the light.

Figure 5D:
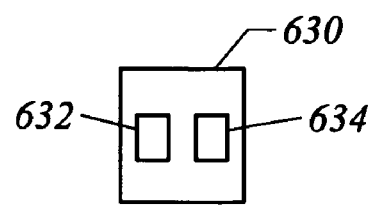
FIG. 5D illustrates a photovoltaic die in a package next to an LED die.

Yet another feature of the invention relates to the assembly of a PV die 632 in an LED package 630 with an LED die 634 adjacent thereto. This is illustrated in FIG. 5D. In many applications for electronic products, it is desirable to have an LED as an indicator lamp or a light source. In some of these applications, it is desirable also to include a PV die to provide electrical charging power. In such applications, a PV die is assembled next to the LED die within the same package of the LED.

This feature uses the LED package for dual purposes. One is to diffuse and spread the LED light out of the package, and another is to concentrate the external incident light into the package and onto the PV die. Furthermore, part of the LED emitted light that is not transmitted out (but is trapped inside the package) is converted back to electrical power by the PV die inside that package. Other combinations of co-packaged LEDs and PV dice can be implemented according to the application needs.

The embodiment described above may be implemented using any of the available LED or optoelectronic packages. A discrete or IC packages may be used in surface mount technology or insertion mount technology, e.g., in SO, or SOT, SIP or DIP standard packages. SO and SOT relate to discrete surface mount packages. SIP refers tot single in line package, and DIP refers to dual in line package.

The present embodiment provides one or more transparent areas above the LED and PV die or dice for multi-chip features.

The present invention has been described in terms of specific embodiment. Accordingly, the present invention may be implemented in other ways.

What is claimed is:

1. A photovoltaic (PV) cell device comprising:
a first semiconductor substrate;
a second semiconductor substrate provided directly below the first semiconductor substrate and bonded to the first semiconductor substrate;
an insulating layer provided between a bottom surface of the first substrate and the second substrate to electrically isolate the first substrate from the second substrate, the insulating layer being substantially planar;
a plurality of PV cells defined on the first substrate, each PV cell including only one n-type region and only one p-type region, the n-type region being formed by performing ion implantation of arsenic on a top surface of the first substrate of said each PV cell to provide a shallow junction depth for the n-type region along a first portion of the top surface of the first substrate, the p-type region being formed in the remaining volume of said each PV cell that is not occupied by the n-type region, the p-type region being formed in said each PV cell along the remaining portion of the top surface of the first substrate and along the entire bottom surface of the first substrate;
a plurality of vertical trenches provided in the first substrate to isolate the PV cells, each vertical trench extending from the top surface of the first substrate to the bottom surface of the first substrate, so that each vertical trench terminates at the insulating layer, each vertical trench having substantially perpendicular sidewalls which are doped with an impurity to provide gettering sites;
a plurality of isolation structures provided within the vertical trenches, each isolation structure including:
a first silicon dioxide isolation layer formed on the doped sidewalls of the trench, and
a second isolation layer of undoped polysilicon formed over the first silicon dioxide isolation layer to fill the trench; and
an interconnect layer patterned to connect the PV cells to provide X number of PV cells in series and Y number of PV cells in parallel.

2. The PV cell device of claim 1, wherein the device comprises N number of tubs defined in the first substrate, wherein each PV cell is defined on one of the tubs.

3. The PV cell device of claim 2, wherein the tubs define the PV cells.

4. The PV cell device of claim 1, wherein the PV cell device is a packaged device comprising:
a PV die including the first and second substrate;
an electronic component configured to perform a given function; and
a transparent package configured to allow light to reach the PV die,
wherein the PV die is configured to power the electronic component using energy generated with the light.

5. The PV cell device of claim 4, wherein the transparent package includes a curved lens provided above the PV die to direct the light toward the first substrate.

6. The PV cell device of claim 1, wherein the first and second substrates are bonded to each other and comprise a silicon-on-insulator structure.

7. The PV cell device of claim 1, wherein each trench has a width that is greater than 5,000 angstroms.

8. The PV cell device of claim 1, wherein each trench has a width of at least 2 microns.

9. The PV cell device of claim 1, wherein each trench has a width of about 3 microns or more.

10. A packaged photovoltaic (PV) device comprising:
a PV structure including a silicon-on-silicon (SOI) structure, the PV structure comprising:
a first semiconductor substrate;
a second semiconductor substrate bonded to the first substrate, the second semiconductor substrate being provided directly below the first semiconductor substrate;
an insulating layer provided between a bottom surface of the first substrate and the second substrate to electrically isolate the first substrate from the second substrate;
a plurality of PV cells defined on the first substrate, each PV cell including only one n-type region and only one p-type region, wherein the n-type region is formed by performing ion implantation of arsenic on a top surface of the first substrate of said each PV cell to provide a shallow junction depth for the n-type region along a first portion of the top surface of the first substrate, wherein the p-type region is formed in the remaining volume of said each PV cell that is not occupied by the n-type region, wherein the p-type region is formed in said each PV cell along the remaining portion of the top surface of the first substrate and along the entire bottom surface of the first substrate;

a plurality of vertical trenches provided in the first substrate to isolate the PV cells, each vertical trench extending from the top surface of the first substrate to the bottom surface of the first substrate, so that each vertical trench terminates at the insulating layer, each vertical trench having substantially perpendicular sidewalls which are doped with an impurity to provide gettering sites;

a plurality of isolation structures provided within the trenches, each isolation structure including: a first silicon dioxide isolation layer formed on the doped sidewalls of the trench, and a second isolation layer of undoped polysilicon formed over the first isolation layer to fill the trench; and an interconnect layer patterned to connect the PV cells to provide X number of PV cells in series and Y number of PV cells in parallel;

an electronic component to perform a given function; and a transparent enclosure that encloses both the PV structure and the electronic component.

11. The packaged PV device 10, wherein the electronic component comprises a light emitting diode.

12. The packaged PV device of claim 10, wherein the transparent enclosure includes a lens to direct light onto the first substrate of the PV structure.

13. The PV cell device of claim 1, wherein the interconnect layer is patterned to:

connect adjacent pairs of PV cells in series along a first axis in the plane of the first substrate to provide series connected pairs;

connect series connected pairs of PV cells in series with adjacent series connected pairs of PV cells along a second axis perpendicular to the first axis to provide sets of series connected PV cells; and connect sets of series connected PV cells in parallel.

14. The PV cell device of claim 13, wherein the PV cell device is a packaged device including a PV die, the PV die including die bonding pads along a first edge of the PV die and wherein the sets of series connected PV cells are connected in parallel along the first edge.

15. The PV cell device of claim 1, wherein the interconnect layer is patterned above the first and second semiconductor substrates.

16. The packaged PV device of claim 10, wherein the interconnect layer of the PV structure is patterned to:

connect adjacent pairs of PV cells in series along a first axis in the plane of the first substrate to provide series connected pairs;

connect series connected pairs of PV cells in series with adjacent series connected pairs of PV cells along a second axis perpendicular to the first axis to provide sets of series connected PV cells; and connect sets of series connected PV cells in parallel.

17. The packaged PV device of claim 16, wherein the PV structure is located on a PV die, the die including bonding pads along a first edge of the PV die and wherein the sets of series connected PV cells are connected in parallel along the first edge.

18. The packaged PV device of claim 10, wherein the interconnect layer of the PV structure is patterned above the first and second semiconductor substrates.

* * * * *